(12) United States Patent
Takagi et al.

(10) Patent No.: US 10,098,229 B2
(45) Date of Patent: Oct. 9, 2018

(54) MODULE, MODULE COMPONENT COMPOSING THE MODULE, AND METHOD OF MANUFACTURING THE MODULE

(71) Applicant: Murata Manufacturing Co., Ltd., Kyoto (JP)

(72) Inventors: Yoichi Takagi, Kyoto (JP); Tadashi Nomura, Kyoto (JP); Masato Yoshida, Kyoto (JP); Nobuaki Ogawa, Kyoto (JP); Mitsuhiro Matsumoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/832,201

(22) Filed: Aug. 21, 2015

(65) Prior Publication Data

US 2015/0366063 A1    Dec. 17, 2015

Related U.S. Application Data

(63) Continuation of application No. PCT/JP2013/078053, filed on Oct. 16, 2013.

(30) Foreign Application Priority Data

Feb. 25, 2013 (JP) .................................. 2013-035012
Jul. 29, 2013 (JP) .................................. 2013-156564

(51) Int. Cl.
  *H05K 1/14* (2006.01)
  *H01L 23/498* (2006.01)
  (Continued)

(52) U.S. Cl.
  CPC ........ *H05K 1/145* (2013.01); *H01L 23/49811* (2013.01); *H01L 23/5385* (2013.01);
  (Continued)

(58) Field of Classification Search
  CPC ......... H05K 1/141; H05K 1/144; H05K 1/145
  (Continued)

(56) References Cited

U.S. PATENT DOCUMENTS 2,958,937 A * 11/1960 Wagner ................ B23K 35/302
                                          228/262.31
6,884,939 B2 * 4/2005 Dishongh ............ H05K 1/0231
                                          174/534
(Continued)

FOREIGN PATENT DOCUMENTS

JP    2002-207986 A    7/2002
JP    2003-142797 A    5/2003
(Continued)

OTHER PUBLICATIONS

English translation of Written Opinion of the International Searching Authority issued in PCT/JP2013/078053 dated Oct. 12, 2013.
(Continued)

*Primary Examiner* — Mukund G Patel
(74) *Attorney, Agent, or Firm* — Pearne & Gordon LLP

(57) ABSTRACT

To provide a compact module that is capable of achieving a low profile and that has excellent high-frequency characteristics, a module includes a parent board; first and second child boards arranged so as to face the parent board; multiple electronic components that include first electrodes and second electrodes electrically connected to the first electrodes, respectively, on both opposing faces, the first electrodes being connected to the first child board, the second electrodes being connected to the parent board; and multiple electronic components that include first electrodes and second electrodes electrically connected to the first electrodes, respectively, on both opposing faces, the first electrodes being connected to the second child board, the second electrodes being connected to the parent board.

17 Claims, 7 Drawing Sheets

(51) Int. Cl.
*H01L 23/538* (2006.01)
*H01L 25/16* (2006.01)
*H05K 3/28* (2006.01)
*H05K 1/09* (2006.01)
*H05K 3/34* (2006.01)

(52) U.S. Cl.
CPC ............. *H01L 25/16* (2013.01); *H05K 1/09* (2013.01); *H05K 1/141* (2013.01); *H05K 3/284* (2013.01); *H05K 3/341* (2013.01); *H01L 2224/16225* (2013.01); *H01L 2924/19105* (2013.01); *H05K 2201/0326* (2013.01); *H05K 2201/09781* (2013.01); *H05K 2201/10522* (2013.01); *H05K 2201/10636* (2013.01); *H05K 2203/1476* (2013.01); *Y02P 70/611* (2015.11); *Y10T 29/4913* (2015.01)

(58) Field of Classification Search
USPC .................................. 361/679.48, 719, 735
See application file for complete search history.

(56) References Cited

U.S. PATENT DOCUMENTS

| | | | |
|---|---|---|---|
| 2004/0082100 A1 | 4/2004 | Tsukahara | |
| 2004/0104469 A1* | 6/2004 | Yagi | G06K 19/07 257/723 |
| 2005/0184381 A1* | 8/2005 | Asahi | H01R 13/2414 257/693 |
| 2006/0158863 A1* | 7/2006 | Hsu | H01L 23/49816 361/760 |
| 2006/0214299 A1* | 9/2006 | Fairchild | H01L 23/142 257/758 |
| 2007/0200217 A1 | 8/2007 | Tsukahara | |
| 2009/0078456 A1* | 3/2009 | Macropoulos | H05K 1/024 174/261 |
| 2010/0008056 A1* | 1/2010 | Ono | H01L 23/5385 361/784 |
| 2010/0214751 A1* | 8/2010 | Aoki | H05K 1/145 361/772 |

FOREIGN PATENT DOCUMENTS

JP 2004-071961 A 3/2004
JP 2012-182293 A 9/2012

OTHER PUBLICATIONS

English translation of International Search report issued in PCT/JP2013/078053 dated Dec. 10, 2013.

* cited by examiner

| (i) | (ii) | (iii) | (iv) | (v) | (vi) | (vii) |
|---|---|---|---|---|---|---|
| Cu-M | Ni/Au | Ni/Au | Cu-M | Cu-M | Ni/Au | Cu-M |
| Sn SYSTEM | Cu-M | Sn SYSTEM | Cu-M | Sn SYSTEM | Cu-M | Cu-M |
| Sn SYSTEM | Sn SYSTEM | Cu-M | Sn SYSTEM | Cu-M | Cu-M | Cu-M |

M: Mn OR Ni

| SAMPLE NUMBER | ALLOY CONTAINED IN CONNECTION PORTION | REMAINING PERCENTAGE OF LOW MELTING POINT METAL (Sn) (VOLUME %) |
|---|---|---|
| 1 | Cu-5Mn | 19 |
| 2 | Cu-10Mn | 0 |
| 3 | Cu-15Mn | 0 |
| 4 | Cu-20Mn | 9 |
| 5 | Cu-30Mn | 21 |
| 6 | Cu-5Ni | 12 |
| 7 | Cu-10Ni | 0 |
| 8 | Cu-15Ni | 0 |
| 9 | Cu-20Ni | 5 |

MODULE, MODULE COMPONENT COMPOSING THE MODULE, AND METHOD OF MANUFACTURING THE MODULE

BACKGROUND

Technical Field

The present disclosure relates to a module including two circuit boards and electronic components, such as integrated circuits (ICs) and chip capacitors, which are arranged between the circuit boards, a module component composing the module, and a method of manufacturing the module.

Background Art

Columnar conductors for connecting to an external mother board or the like are mounted on a circuit board in a module as illustrated in FIG. 10 (refer to Patent Document 1). A module 100 includes a circuit board 101 having wiring electrodes formed on the surface thereof or formed therein; multiple electronic components 102 which are mounted on one principal surface of the circuit board 101 and which include chip components 102a, such as chip capacitors, and an IC 102b, which is a semiconductor device; multiple columnar conductors 103 mounted on the one principal surface of the circuit board 101; and a resin layer 104 with which the electronic components 102 and the columnar conductors 103 are covered. An end face of each columnar conductor 103 exposed on the surface of the resin layer 104 is connected to a certain electrode formed on an external mother board or the like with, for example, solder to connect the circuit board 101 to the mother board or the like.

At this time, each columnar conductor 103 has a function to electrically connect the circuit board 101 to the external mother board or the like, a function as a spacer to arrange each electronic component 102 between the circuit board 101 and the mother board, and a fixing function to fix the circuit board 101 on the mother board.

Patent Document 1: Japanese Unexamined Patent Application Publication No. 2004-71961 (refer to paragraphs 0023 to 0026 and FIG. 1 and so on)

BRIEF SUMMARY

However, the mounting of each columnar conductor 103 on the circuit board 101 in the above manner requires the mounting area to be ensured on the circuit board 101 and it is difficult to reduce the size of the module 100. In addition, it is necessary to make the length of each columnar conductor 103 longer than the height of each electronic component 102 mounted on the circuit board 101 from the circuit board 101. This hinders low profile of the module 100.

The wiring electrode to connect each columnar conductor 103 to a certain terminal of the corresponding electronic component 102 is formed on the circuit board 101. The area of the principal surface of the circuit board and the number of layers of the circuit board may be increased by the amount corresponding to the formation of the wiring electrodes. In such a case, the reduction in size and the low profile of the module are hindered. In addition, when high-frequency waves are used for the module 100, an increase in length of the wiring electrode may increase unnecessary impedance and a parasitic component, such as parasitic inductance and/or increase unnecessary radiant waves to cause a problem of deterioration in high-frequency characteristics of the module 100.

In order to resolve the above problems, the present disclosure provides a compact module that is capable of achieving low profile and that is excellent in high-frequency characteristics.

The present disclosure provides a module including a first circuit board; a second circuit board arranged so as to face the first circuit board; and a functional component that includes a first electrode and a second electrode electrically connected to the first electrode on both opposing faces. The first electrode is connected to the first circuit board, and the second electrode is connected to the second circuit board.

Since the second electrode of the functional component, which is connected to the second circuit board, is electrically connected to the first electrode, it is not necessary to provide the columnar conductor to electrically connect the first electrode of the functional component to the second circuit board, unlike the module in related art. Accordingly, since it is not necessary to ensure the area in which the columnar conductor is mounted in each of the first circuit board and the second circuit board, the areas of the principal surfaces of the first circuit board and the second circuit board are capable of being decreased, thereby reducing the size of the module.

In the configuration in which the first circuit board is connected to the second circuit board with the columnar conductors, as in the module in the related art, since the lengths of the columnar conductors are required to be greater than the heights of the functional components from the first child board, it is difficult to achieve the low profile of the module. However, with the above configuration, the functional component includes the first electrode and the second electrode on both opposing faces, and the first circuit board is connected to the second circuit board by connecting the first electrode to the first circuit board and connecting the second electrode to the second circuit board. Accordingly, the distance between the first child board and the second circuit board is capable of being substantially equal to the height of the functional component from the first child board. Consequently, it is possible to achieve the low profile of the module.

For example, when each functional component is connected to the second circuit board with the columnar conductor, as in the module in the related art, it is necessary to provide the wiring electrode used to connect each functional component to the columnar conductor on the first circuit board, as described above. However, with the above configuration, since the first electrode is connected to the second circuit board via the second electrode electrically connected to the first electrode, it is not necessary to provide the wiring electrode to connect the first electrode to the columnar conductor on the first circuit board. Accordingly, since the area of the principal surface of the first child board or the number of layers of the first child board is decreased by the amount corresponding to the non-provision of the wiring electrode, it is possible to reduce the size of the module and to achieve the low profile of the module. Also when the second electrode is connected to the first circuit board, since the second electrode is connected to the first circuit board via the first electrode electrically connected to the second electrode without necessarily providing the wiring electrode on the second circuit board, it is possible to reduce the size of the module and to achieve the low profile of the module.

It is not necessary to provide the wiring electrode on the child board. Accordingly, for example, when high-frequency signals are used for the module, it is possible to prevent an increase in unnecessary impedance and an increase in a parasitic component, such as parasitic inductance, which are caused by the increase in length of the wiring electrode, and it is possible to prevent an increase in unnecessary radiant waves occurring from the wiring electrode. Accordingly, the module having excellent high-frequency characteristics is provided.

A board-side electrode may be formed on a face facing the second circuit board of the first circuit board, and the first electrode may be connected to the board-side electrode with solder. In this case, it is possible to connect the board-side electrode on the first circuit board to the first electrode of the functional component with the solder, which is commonly used as the material for connection of electrodes.

At least one of the board-side electrode, the first electrode, and the solder may contain Cu-M alloy (M indicates Mn or Ni). In this case, since high melting point Sn—Cu-M alloy (M indicates Mn or Ni) is formed in the connection portion between the board-side electrode and the first electrode, it is possible to prevent a position shift of the functional component and/or a solder (the solder to connect the board electrode to the electrode) drip, which is caused by the melting of the alloy forming the connection portion between the board-side electrode and the first electrode due to the heat generated in the subsequent connection of the second electrode of the functional component to the second circuit board with the solder.

An amount of M contained in the Cu-M alloy may be 5% by weight to 30% by weight. The high melting point of the Sn—Cu-M alloy (M indicates Mn or Ni) forming the connection portion between the board-side electrode on the first circuit board and the first electrode of the functional component is considered to be realized by an intermetallic compound formed between Sn and the Cu-M alloy. Accordingly, the inventor varied the amount of M contained in the Cu-M alloy by experiment and measured the remaining percentage of Sn, low melting point metal, which does not contribute to the formation of the intermetallic compound in the connection portion between the board-side electrode and the first electrode. The measurement indicated that the remaining percentage of Sn is reduced when the amount of M contained in the Cu-M alloy is 5% by weight to 30% by weight.

The first electrode of the functional component may be connected to the first circuit board at substantially the center. When the first circuit board is thermally contracted, the amount of contraction of the first child board at the center is smaller than that on the fringe. Specifically, the stress applied on the connection portion between the first electrode and the first circuit board when the first electrode of the functional component is connected to the center of the first circuit board is lower than that when the first electrode of the functional component is connected to the fringe of the first circuit board. Accordingly, the connection of the first electrode of the functional component to substantially the center of the first circuit board improves the reliability of the connection between the first circuit board and the functional component.

The module may include multiple functional components. Since the first electrode is connected to the first circuit board and the second electrode is connected to the second circuit board in each functional component, each functional component has the fixing function to fix one of the first circuit board and the second circuit board to the other thereof. Accordingly, fixing one of the first circuit board and the second circuit board to the other thereof using the multiple functional components improves the fixing function, compared with a case in which one of the first circuit board and the second circuit board is fixed to the other thereof using one functional component.

The second electrode of part of the functional components may be connected to a dummy electrode provided on the second circuit board. With this configuration, for example, even when there is the electronic component that is not required to be electrically connected to the second circuit board, among the electronic components, the connection of the second electrode of the functional component to the dummy electrode provided on the second circuit board allows the electronic component to contribute to the improvement of the fixing function of both of the circuit boards by the functional components.

The module may further include a first electronic component mounted on a face opposite to a connection face with the functional component of either one of the first circuit board and the second circuit board. Mounting the first electronic component also on a face opposite to the connection face with the functional component of one of the first circuit board and the second circuit board in this manner allows the components in the module to be mounted with a high density.

The module may further include a first sealing resin layer which is provided over a face on which the first electronic component is mounted of either one of the first circuit board and the second circuit board and with which the first electronic component is covered. With this configuration, it is possible to protect the first electronic component with the first sealing resin layer.

In addition, for example, when the first electrode of the functional component is connected to the connection face with the functional component of the first circuit board and the first circuit board-component assembly produced by mounting the first electronic component on the mounting face of the first circuit board is mounted on the second circuit board using a general component mounting apparatus, the mounting capability of the first circuit board-component assembly on the second circuit board is improved. Specifically, performing the suctioning (picking up) of the first circuit board-component assembly by the component mounting apparatus in the portion where the first sealing resin layer is formed, which is provided on the mounting face of the first circuit board, allows the first circuit board-component assembly to be mounted on the second circuit board without necessarily any damage of the first electronic component. In addition, since making the surface of the first sealing resin layer flat allows a larger suction face to be ensured when the first circuit board-component assembly is suctioned by the component mounting apparatus, the first circuit board-component assembly is easily mounted on the second circuit board.

The module may further include a second sealing resin layer with which the first electronic component and either one of the first circuit board and the second circuit board are covered and with which a connection face with the functional component of the other of the first circuit board and the second circuit board is covered. With this configuration, it is possible to protect one of the circuit boards, the functional component, and the first electronic component, which are arranged on the connection face with the functional component of the other of the first circuit board and the second circuit board, with the second sealing resin layer.

The module may further include a third sealing resin layer with which the first sealing resin layer is covered and with which a connection face with the functional component of the other of the first circuit board and the second circuit board is covered. With this configuration, it is possible to improve the mounting capability of the first circuit board-component assembly on the second circuit board with the first sealing resin layer, as described above, and it is possible to protect the first circuit board-component assembly and the functional component with the third sealing resin layer.

An area of either one of the first circuit board and the second circuit board viewed in plan (in a direction perpendicular to a largest surface of the first circuit board and the second circuit board) may be greater than an area of the other thereof. The module may further include a second electronic component mounted on an area that is on a connection face with the functional component of either one of the first circuit board and the second circuit board, which has an area greater than that of the other, and that is not overlapped with the other viewed in plan. A height of the second electronic component may be greater than a distance between the first circuit board and the second circuit board.

Mounting the second electronic component the height of which is greater than the distance between the first circuit board and the second circuit board on an area that is on the connection face with the functional component of either one of the first circuit board and the second circuit board, which has an area greater than that of the other, and that is not overlapped with the other viewed in plan in this manner allows the low profile of the module to be achieved, compared with a configuration in which the second electronic component is arranged between the first circuit board and the second circuit board, which are overlapped with each other viewed in plan.

The present disclosure provides a module component mounted on a mounting board. The module component includes a first circuit board arranged so as to face the mounting board in the mounting of the module component on the mounting board; and a functional component which includes a first electrode and a second electrode electrically connected to the first electrode on both opposing faces. The first electrode is connected to the first circuit board. The module component is mounted on the mounting board by connecting the second electrode of the functional component to the mounting board.

With this configuration, since provision of the columnar conductor to connect the first electrode of each functional component in the module component to the mounting board is not required, it is not necessary to ensure the area in which the columnar conductor is to be mounted on the first circuit board. Accordingly, the area of the principal surface of the first circuit board is reduced, thereby reducing the size of the mounting board.

In the configuration in which the columnar conductors for connection to the mounting board are provided in the mounting board, as in the related art, since the lengths of the columnar conductors are required to be greater than the heights of the functional components from the first child board, it is difficult to achieve the low profile of the module component. However, with the above configuration, since the module component is mounted on the mounting board without necessarily providing the columnar conductors by connecting the second electrode of each functional component to the mounting board, it is possible to achieve the low profile of the module component.

When the mounting board is connected to the first electrode of each functional component with the columnar conductor, as in the related art, it is necessary to provide the wiring electrode to connect the columnar conductor to the first electrode on the first circuit board. However, with the above configuration, since the first electrode is mounted on the mounting board via the second electrode electrically connected to the first electrode, it is not necessary to provide the wiring electrode to connect the first electrode to the columnar conductor on the first circuit board. Accordingly, since the area of the principal surface of the first child board or the number of layers of the first child board is decreased by the amount corresponding to the non-provision of the wiring electrode, it is possible to reduce the size of the module component and to achieve the low profile of the module component. In addition, for example, when the high-frequency waves are used for the module component, it is possible to prevent an increase in unnecessary impedance and an increase in a parasitic component, such as parasitic inductance, which are caused by the increase in length of the wiring electrode, and it is possible to prevent an increase in unnecessary radiant waves occurring from the wiring electrode. Accordingly, the module component having excellent high-frequency characteristics is provided.

A board-side electrode may be formed on a face facing the mounting board of the first circuit board, and the first electrode may be connected to the board-side electrode with solder. In this case, it is possible to connect the board-side electrode on the first circuit board to the first electrode of the functional component with the solder, which is commonly used as the material for connection of electrodes.

At least one of the board-side electrode, the first electrode, and the solder may contain Cu-M alloy (M indicates Mn or Ni). In this case, since the high melting point Sn—Cu-M alloy is formed in the connection portion between the board-side electrode and the first electrode, it is possible to prevent a position shift of the functional component and/or a solder (the solder to connect the board electrode to the electrode) drip, which is caused by the melting of the alloy forming the connection portion between the board-side electrode and the first electrode due to the heat generated in the subsequent connection of the second electrode of the functional component to the mounting board with the solder.

An amount of M contained in the Cu-M alloy may be 5% by weight to 30% by weight. As described above, the high melting point of the Sn—Cu-M alloy (M indicates Mn or Ni) forming the connection portion between the board-side electrode on the first circuit board and the first electrode of the functional component is considered to be realized by an intermetallic compound formed between Sn and the Cu-M alloy. Accordingly, the inventor varied the amount of M contained in the Cu-M alloy by experiment and measured the remaining percentage of Sn, low melting point metal, which does not contribute to the intermetallic compound in the connection portion between the board-side electrode and the first electrode. The measurement indicated that the remaining percentage of Sn is reduced when the amount of M contained in the Cu-M alloy is 5% by weight to 30% by weight.

The present disclosure provides a method of manufacturing a module. The method includes preparing a board-component assembly which includes a functional component having a first electrode and a second electrode electrically connected to the first electrode on both opposing faces and a first circuit board, the first electrode being connected to the first circuit board; mounting the board-component assembly on a second circuit board by arranging a connection face with the first electrode of the functional component of the first circuit board so as to face one principal surface of the second circuit board and connecting the second electrode of the functional component to the one principal surface of the second circuit board; and forming a resin layer so that the one principal surface of the second circuit board and the board-component assembly mounted on the one principal surface of the second circuit board are covered with the resin layer.

In this case, mounting the board-component assembly on the second circuit board by connecting the second electrode electrically connected to the first electrode of the functional component to the one principal surface of the second circuit board allows the module in which the first electrode of the functional component is connected to the second circuit board to be manufactured. Accordingly, it is possible to manufacture the compact module capable of achieving the low profile, compared with the configuration in the related art in which the first electrode of the functional component is connected to the second circuit board with the columnar conductor.

According to the present disclosure, the module includes a first circuit board; a second circuit board arranged so as to face the first circuit board; and a functional component that includes a first electrode and a second electrode electrically connected to the first electrode on both opposing faces. The first electrode is connected to the first circuit board, and the second electrode is connected to the second circuit board. Since the second electrode of the functional component connected to the second circuit board is electrically connected to the first electrode, it is not necessary to provide the columnar conductor in order to connect the first electrode of the functional component to the second circuit board, unlike the module in the related art. Accordingly, since it is not necessary to ensure the area in which the columnar conductor is mounted in each of the first circuit board and the second circuit board, the areas of the principal surfaces of the first circuit board and the second circuit board are capable of being decreased, thereby reducing the size of the module.

DESCRIPTION OF EMBODIMENTS

First Embodiment

Figure 1:
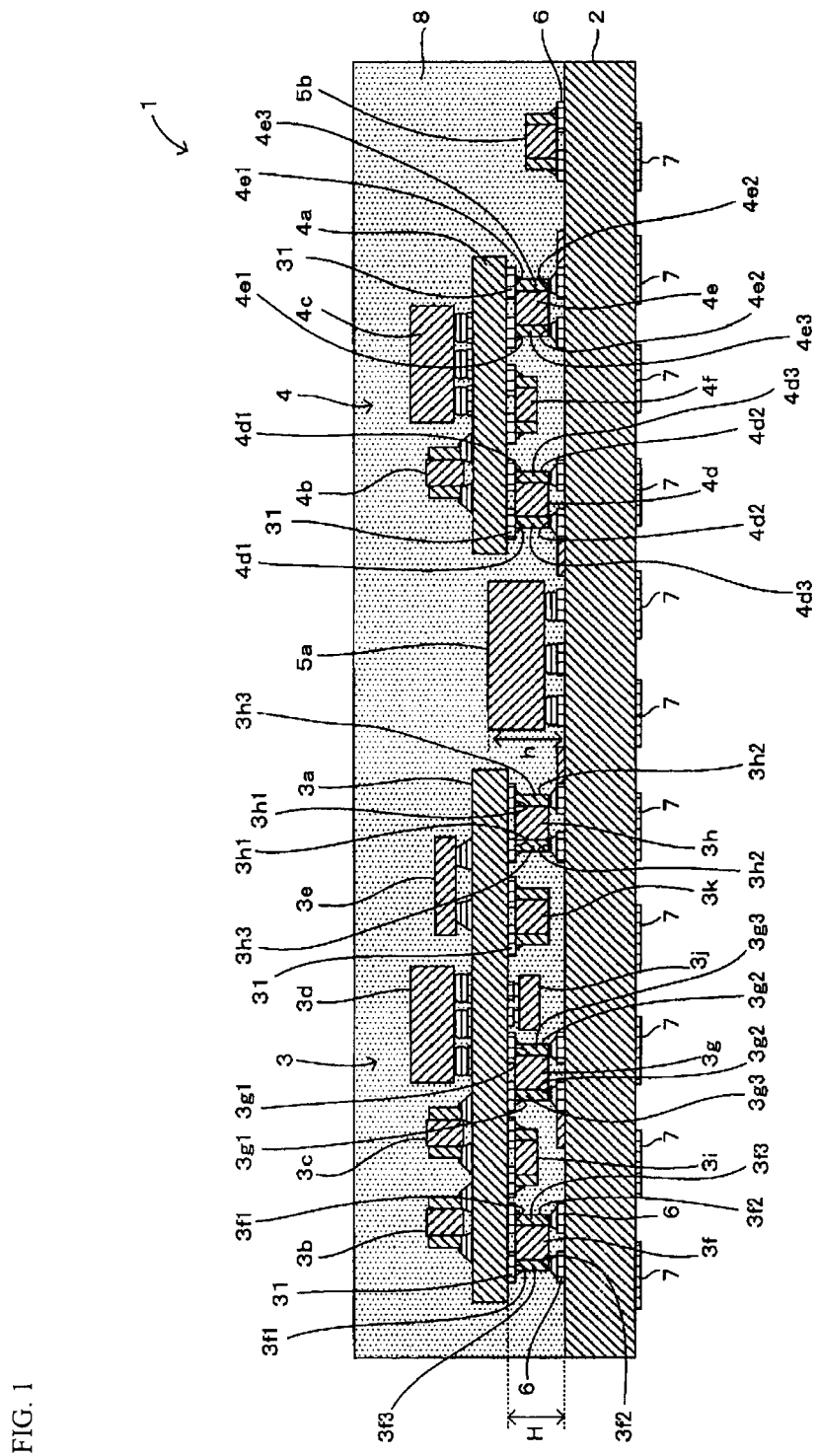
FIG. 1 is a cross-sectional view of a module according to a first embodiment of the present disclosure.

A module 1 according to a first embodiment of the present disclosure will now be described with reference to FIG. 1. FIG. 1 is a cross-sectional view of the module 1 according to the first embodiment.

The module 1 according to the present embodiment includes a parent board 2, a first child board-component assembly 3, a second child board-component assembly 4, electronic components 5a and 5b, and a resin layer 8, as illustrated in FIG. 1. The first child board-component assembly 3, the second child board-component assembly 4, and the electronic components 5a and 5b are mounted on one principal surface of the parent board 2. For example, the module 1 is used as a power supply circuit module or a radio circuit module. The first child board-component assembly 3 and the second child board-component assembly 4 each correspond to a board-component assembly of the present disclosure.

The parent board 2 is made of, for example, resin, ceramics, glass, or the like. Multiple mounting electrodes 6 used to mount the first child board-component assembly 3, the second child board-component assembly 4, and both of the electronic components 5a and 5b are formed on the one principal surface of the parent board 2 and outer electrodes 7 used to connect the module 1 to the outside are formed on the other principal surface of the parent board 2. Via conductors (not illustrated), wiring electrodes (not illustrated), and so on are also formed in the parent board 2. The parent board 2 corresponds to a second circuit board of the present disclosure.

The first child board-component assembly 3 includes a first child board 3a arranged so as to face the parent board 2, multiple electronic components 3b to 3e mounted on one principal surface of the first child board 3a, and multiple electronic components 3f to 3k mounted on the other principal surface of the first child board 3a. The electronic components 3f to 3k are arranged between the parent board 2 and the first child board 3a. In the present embodiment, the area of the first child board 3a viewed in plan is made smaller than that of the parent board 2. The first child board 3a corresponds to a first circuit board of the present disclosure and each of the electronic components 3b to 3e mounted on the one principal surface of the first child board 3a corresponds to a first electronic component of the present disclosure.

Each of the electronic components 3b to 3k is formed of any of chip components including an IC, a chip capacitor, and a chip inductor, which are made of Si, GaAs, or the like. For example, a bypass capacitor, a chip resistor, a 0-ohm resistor (jumper chip), a fuse, a varistor, a filter, a ferrite bead, or a common-mode choke coil may be used as the electronic component.

As illustrated in FIG. 1, the three electronic components 3f to 3h (each of the electronic components 3f to 3h is a chip component, such as a chip capacitor or a chip inductor, in the present embodiment), among the electronic components 3f to 3k arranged between the parent board 2 and the first child board 3a, are connected to both the first child board 3a and the parent board 2. The electronic components 3f to 3h include first electrodes 3f1 to 3h1 and second electrodes 3f2 to 3h2, respectively, on both opposing faces. The first electrodes 3f1 to 3h1 are connected to the first child board 3a and the second electrodes 3f2 to 3h2 are connected to the parent board 2.

Specifically, the electronic component 3f has the two first electrodes 3f1 formed on its face facing the first child board 3a, the electronic component 3g has the two first electrodes 3g1 formed on its face facing the first child board 3a, and the electronic component 3h has the two first electrodes 3h1 formed on its face facing the first child board 3a. The electronic component 3f has the two second electrodes 3f2 formed on its face facing the parent board 2, the electronic component 3g has the two second electrodes 3g2 formed on its face facing the parent board 2, and the electronic component 3h has the two second electrodes 3h2 formed on its face facing the parent board 2. The first electrodes 3f1 to 3h1 are directly connected to board-side electrodes 31 formed on a face facing the parent board 2 of the first child board 3a (the other principal surface of the first child board 3a) with solder. The second electrodes 3f2 to 3h2 are directly connected to the mounting electrodes 6 of the parent board 2 with solder. In order to facilitate the connection to the first child board 3a and the parent board 2 in each of the electronic components 3f to 3h, the electronic components 3f to 3h may have substantially the same height from the other principal surface of the first child board 3a.

In the electronic component 3f, each first electrode 3f1 is electrically connected to the corresponding second electrode 3f2 with a side-face electrode 3f3. In the electronic component 3g, each first electrode 3g1 is electrically connected to the corresponding second electrode 3g2 with a side-face electrode 3g3. In the electronic component 3h, each first electrode 3h1 is electrically connected to the corresponding second electrode 3h2 with a side-face electrode 3h3. The first electrodes 3f1 to 3h1 are not limitedly connected to the second electrodes 3f2 to 3h2 with the side-face electrodes 3f3 to 3h3, respectively. The first electrodes 3f1 to 3h1 may be connected to the second electrodes 3f2 to 3h2, respectively, with columnar conductors, such as via conductors or post electrodes, wiring electrodes, or the likes provided in the electronic components 3f to 3h.

Each of the electronic components 3f to 3h connected to both the parent board 2 and the first child board 3a corresponds to a functional component of the present disclosure. The functional component is a component functioning as a capacitor, an inductor, a drive circuit, or the like in the module 1 and is not a component used only for conduction, such as a columnar conductor that connects layers to each other. For example, when the module 1 is used as a power management module and a bypass capacitor is used as the functional component arranged between the circuit and the ground, the efficiency and load regulation characteristics are improved. A 0-ohm resistor (jumper chip) may be used as the functional component arranged on the circuit. Arrangement of a fuse varistor allows overcurrent to be prevented. When the module 1 is used as a radio circuit module, use of a filter, a ferrite bead, a common-mode choke coil, or the like as the functional component allows noise to be reduced to improve high-frequency characteristics.

As described above, the connection of the first electrodes 3f1 to 3h1 in the electronic components 3f to 3h, respectively, to the first child board 3a and the connection of the second electrodes 3f2 to 3h2 in the electronic components 3f to 3h, respectively, to the parent board 2 fix the first child board-component assembly 3 (the first child board 3a) to the parent board 2. In addition, since the first electrodes 3f1 to 3h1 are electrically connected to the second electrodes 3f2 to 3h2 with the side-face electrodes 3f3 to 3h3, respectively, it is possible to electrically connect the first child board 3a to the parent board 2 without necessarily providing the columnar conductors, unlike the module in the related art.

The second child board-component assembly 4 has substantially the same configuration as that of the first child board-component assembly 3 described above. The second child board-component assembly 4 includes a second child board 4a arranged so as to face the parent board 2, multiple electronic components 4b and 4c mounted on one principal surface of the second child board 4a, and multiple electronic components 4d to 4f mounted on the other principal surface of the second child board 4a. The electronic components 4d to 4f are arranged between the parent board 2 and the second child board 4a. In the present embodiment, the area of the second child board 4a viewed in plan is made smaller than that of the parent board 2. The second child board 4a also corresponds to the first circuit board of the present disclosure and each of the electronic components 4b and 4c mounted on the one principal surface of the second child board 4a also corresponds to the first electronic component of the present disclosure.

Each of the electronic components 4b to 4f is formed of any of chip components including an IC, a chip capacitor, and a chip inductor, which are made of Si, GaAs, or the like, like the electronic components 3b to 3k in the first child board-component assembly 3. For example, a bypass capacitor, a chip resistor, a 0-ohm resistor (jumper chip), a fuse, a varistor, a filter, a ferrite bead, or a common-mode choke coil may be used as each of the electronic components 4b to 4f.

As illustrated in FIG. 1, the two electronic components 4d and 4e (each of the electronic components 4d and 4e is a chip component, such as a chip capacitor or a chip inductor, in the present embodiment), among the electronic components 4d to 4f arranged between the parent board 2 and the second child board 4a, are connected to both the second child board 4a and the parent board 2, as in the first child board-component assembly 3. The electronic component 4d has two first electrodes 4d1 formed on its face facing the second child board 4a and the electronic component 4e has two first electrodes 4e1 formed on its face facing the second child board 4a. The electronic component 4d has two second electrodes 4d2 formed on its face facing the parent board 2 and the electronic component 4e has two second electrodes 4e2 formed on its face facing the parent board 2. The first electrodes 4d1 and 4e1 are directly connected to the board-side electrodes 31 formed on a face facing the parent board 2 of the second child board 4a (the other principal surface of the second child board 4a) with solder. The second electrodes 4d2 and 4e2 are directly connected to the parent board 2 with solder.

In the electronic component 4d, each first electrode 4d1 is electrically connected to the corresponding second electrode 4d2 with a side-face electrode 4d3. In the electronic component 4e, each first electrode 4e1 is electrically connected to the corresponding second electrode 4e2 with a side-face electrode 4e3. The first electrodes 4d1 and 4e1 are not limitedly connected to the second electrodes 4d2 and 4e2 with the side-face electrodes 4d3 and 4e3, respectively. The first electrodes 4d1 and 4e1 may be connected to the second electrodes 4d2 and 4e2, respectively, with columnar conductors, such as via conductors or post electrodes, wiring electrodes, or the likes provided in the electronic components 4d and 4e. Each of the electronic components 4d and 4e connected to both the parent board 2 and the second child board 4a also corresponds to the functional component of the present disclosure.

As described above, the connection of the first electrodes 4d1 and 4e1 in the electronic components 4d and 4e, respectively, to the second child board 4a and the connection of the second electrodes 4d2 and 4e2 in the electronic components 4d and 4e, respectively, to the parent board 2 fix the second child board-component assembly 4 (the second child board 4a) to the parent board 2. In addition, since the first electrodes 4d1 and 4e1 are electrically connected to the second electrodes 4d2 and 4e2 with the side-face electrodes 4d3 and 4e3, respectively, it is possible to electrically connect the second child board 4a to the parent board 2 without necessarily providing the columnar conductors, unlike the module in the related art.

Each of the electronic components 5a and 5b mounted on the one principal surface of the parent board 2 is formed of any of chip components including an IC, a chip capacitor, and a chip inductor, which are made of Si, GaAs, or the like, as in the electronic components 3b to 3k in the first child board-component assembly 3 and the electronic components 4b to 4f in the second child board-component assembly 4. In addition, as illustrated in FIG. 1, the electronic components 5a and 5b are mounted in areas that are not overlapped with the first and second child boards 3a and 3b when the one principal surface of the parent board 2 is viewed in plan. Here, a height h of the electronic component 5a from the one principal surface of the parent board 2 is made greater than, for example, a distance H between the first child board 3a and the parent board 2. The electronic component 5a corresponds to a second electronic component of the present disclosure.

The resin layer 8 is made of, for example, epoxy resin. The first child board-component assembly 3, the second child board-component assembly 4, the electronic components 5a and 5b, and the one principal surface of the parent board 2, which is a connection face with the functional components (the electronic components 3f to 3h, 4d, and 4e), are covered with the resin layer 8. The resin layer 8 corresponds to a second sealing resin layer of the present disclosure.

(Method of Manufacturing Module 1)

Figure 2A:
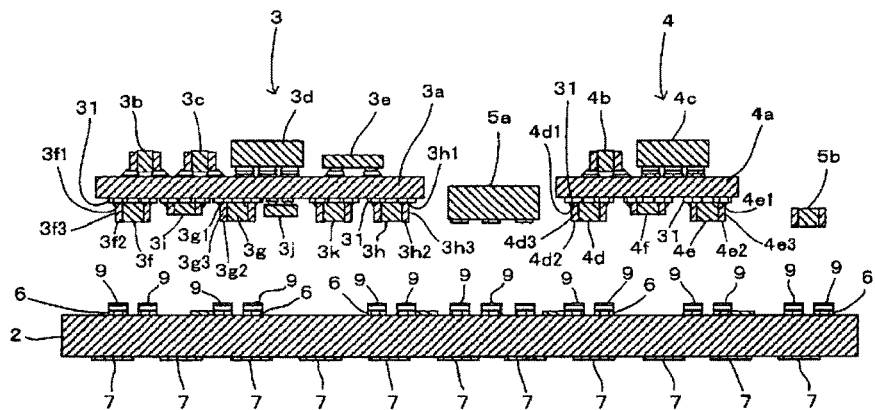
FIGS. 2A-2C include diagrams for describing a method of manufacturing the module in FIG. 1.
Figure 2B:
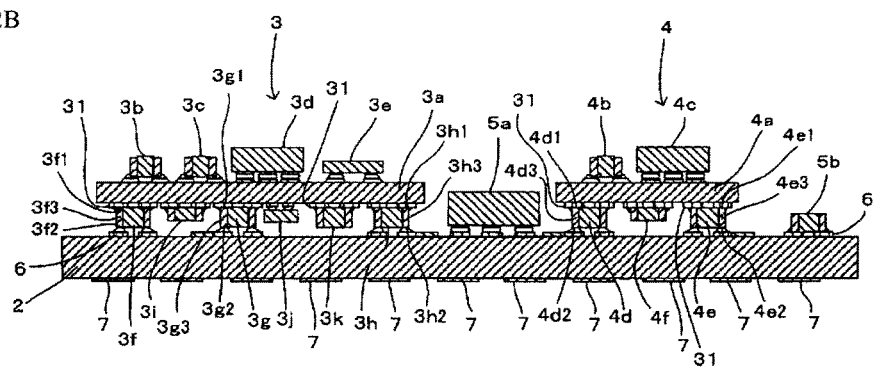
Figure 2C:
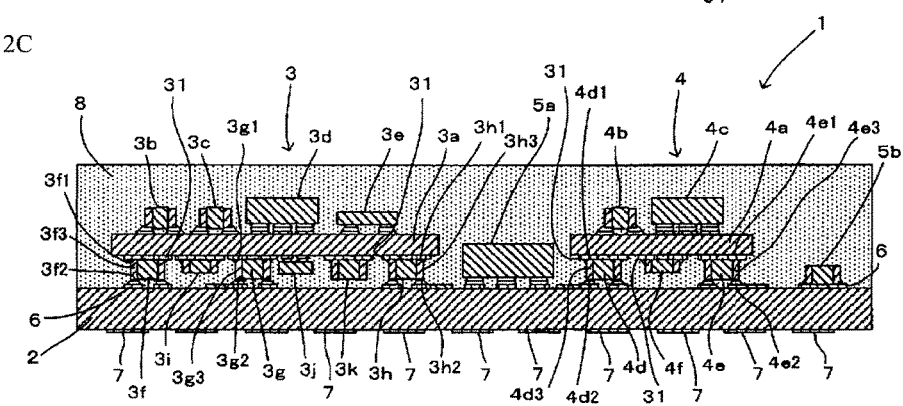

A method of manufacturing the module 1 will now be described with reference to FIGS. 2A-2C. FIGS. 2A-2C include diagrams for describing the method of manufacturing the module 1. FIG. 2A to FIG. 2C illustrate steps.

First, as illustrated in FIG. 2A, the first child board-component assembly 3, the second child board-component assembly 4, the two electronic components 5a and 5b, and the parent board 2 are prepared. The first child board-component assembly 3 is produced by mounting the electronic components 3b to 3k on both principal surfaces of the first child board 3a using a surface mount technology. The second child board-component assembly 4 is produced by mounting the electronic components 4b to 4f on both principal surfaces of the second child board 4a using a surface mount technology. The parent board 2 has the multiple mounting electrodes 6 formed on one principal surface thereof and has the multiple outer electrodes 7 for connection to the outside, which are formed on the other principal surface thereof. Solder paste 9 is applied in advance on each of the mounting electrodes 6 formed on the one principal surface of the parent board 2 using a print technology or the like.

Next, as illustrated in FIG. 2B, the first child board-component assembly 3, the second child board-component assembly 4, and the electronic components 5a and 5b are mounted at certain positions on the one principal surface of the parent board 2 using a component mounting apparatus. Then, the parent board 2 having the first child board-component assembly 3, the second child board-component assembly 4, and the electronic components 5a and 5b mounted thereon is put into a reflow oven or the like to mount the first child board-component assembly 3, the second child board-component assembly 4, and the electronic components 5a and 5b on the parent board 2.

Finally, as illustrated in FIG. 2C, the resin layer 8 is formed so that the first child board-component assembly 3, the second child board-component assembly 4, the electronic components 5a and 5b, and the one principal surface of the parent board 2, which is the connection face with the electronic components 3f to 3h, 4d, and 4e, are covered with the resin layer 8 to manufacture the module 1. Here, the resin layer 8 may be formed with various methods including a compression molding method, a transfer molding method, and a print method. As described above, mounting the first and second child board-component assemblies 3 and 4 on the parent board 2 connects the first electrodes 3f1 to 3h1, 4d1, and 4e1 of the electronic components 3f to 3h, 4d, and 4e in both of the child board-component assemblies 3 and 4 to the parent board 2. Accordingly, compared with the configuration of the module in the related art in which the first electrodes 3f1 to 3h1, 4d1, and 4e1 are connected to the parent board 2 with the columnar conductors, it is possible to manufacture the compact module 1 capable of achieving the low profile.

Accordingly, according to the above embodiment, since the first electrodes 3f1 to 3h1 of the electronic components 3f to 3h (the functional components), which are connected to the first child board 3a, are electrically connected to the second electrodes 3f2 to 3h2 connected to the parent board 2 with the side-face electrodes 3f3 to 3h3 in the first child board-component assembly 3, it is not necessary to provide the columnar conductors in the module in the related art, for example, in order to electrically connect the first electrodes 3f1 to 3h1 of the electronic components 3f to 3h to the parent board 2. Consequently, since it is not necessary to ensure the areas in which the columnar conductors are mounted in the first child board 3a and the parent board 2, the areas of the principal surfaces of the first child board 3a and the parent board 2 are capable of being decreased, thereby reducing the size of the module 1. Since the second child board-component assembly 4 has substantially the same configuration as that of the first child board-component assembly 3, the same advantages are achieved.

In the configuration in which the first child board 3a (or the second child board 4a) is connected to the parent board 2 with the columnar conductors, as in the module in the related art, since the lengths of the columnar conductors are required to be greater than the heights of the electronic components 3f to 3k (or the electronic components 4d to 4f), arranged between the first child board 3a (or the second child board 4a) and the parent board 2, from the first child board 3a (or the second child board 4a), it is difficult to achieve the low profile of the module 1. However, according to the above embodiment, it is not necessary to provide the columnar conductors, the distance between the first child board 3a (or the second child board 4a) and the parent board 2 is capable of being substantially equal to the height of the electronic components 3f to 3k (or the electronic components 4d and 4e) from the first child board 3a (or the second child board 4a) (the height of the tallest electronic component). Accordingly, it is possible to achieve the low profile of the module 1.

For example, when the first electrode 3f1 of the electronic component 3f (the functional component) in the first child board-component assembly 3 is connected to the parent board 2 with the columnar conductor, as in the module in the related art, it is necessary to provide the wiring electrode used to connect the first electrode 3f1 to the columnar conductor on the first child board 3a. In such a case, the area of the principal surface of the first child board 3a or the number of layers of the first child board 3a may require to be increased. In contrast, it is not necessary to provide the wiring electrode used to connect the first electrode 3f1 to the columnar conductor on the first child board 3a in the above embodiment because the first electrode 3f1 is electrically connected to the second electrode 3f2 connected to the parent board 2 via the side-face electrode 3f3. Accordingly, since the area of the principal surface of the first child board 3a or the number of layers of the first child board 3a is decreased by the amount corresponding to the non-provision of the wiring electrodes, it is possible to reduce the size of the module 1 and to achieve the low profile of the module 1.

Since it is not necessary to provide the wiring electrodes on the parent board 2 also when the second electrode 3f2 is to be connected to the first child board 3a, it is possible to decrease the area of the principal surface of the parent board 2 and the number of layers of the parent board 2, thereby reducing the size of the module 1 and achieving the low profile of the module 1. Since the second child board-component assembly 4 has substantially the same configuration as that of the first child board-component assembly 3, the same advantages are achieved.

It is not necessary to provide the wiring electrodes on the first child board 3a (or the second child board 4a). Accordingly, for example, when the high-frequency waves are used for the module 1, it is possible to prevent an increase in unnecessary impedance and an increase in a parasitic component, such as parasitic inductance, which are caused by the increase in length of the wiring electrodes, and it is possible to prevent an increase in unnecessary radiant waves occurring from the wiring electrodes. Accordingly, the module 1 having excellent high-frequency characteristics is provided.

In the first child board-component assembly 3, since the first electrodes 3f1 to 3h of the electronic components 3f to 3h (the functional components) are connected to the first child board 3a and the second electrodes 3f2 to 3h2 of the electronic components 3f to 3h (the functional components) are connected to the parent board 2, each of the electronic components 3f to 3h has the fixing function to fix the first child board 3a to the parent board 2. Since the fixing function is achieved by the multiple (three in the above embodiment) electronic components 3f to 3h (the functional components) in the above embodiment, the fixing function is improved, compared with a case in which the fixing function is achieved by one electronic component (the functional component). Since the second child board-component assembly 4 has substantially the same configuration as that of the first child board-component assembly 3, the same advantages are achieved.

In addition to the mounting of the electronic components 3f to 3k (or the electronic components 4d and 4e) on the other principal surface of the first child board 3a (or the second child board 4a), the electronic components 3b to 3e (or the electronic components 4b and 4c) are mounted also on the one principal surface of the first child board 3a (or the second child board 4a). Accordingly, it is possible to mount the electronic components 3b to 3k and 4b to 4f in the module 1 with a high density. Since the configuration is adopted in which the first child board-component assembly 3 having the multiple electronic components 3b to 3k mounted therein and the second child board-component assembly 4 having the multiple electronic components 4b to 4f mounted therein are mounted on the parent board 2, it is possible to mount the electronic components 3b to 3k and 4b to 4f in the module 1 with a high density, thereby reducing the size of the module 1.

Since the resin layer 8 with which the first child board-component assembly 3, the second child board-component assembly 4, the electronic components 5a and 5b, and the one principal surface of the parent board 2 are covered is formed in the module 1, it is possible to protect the first child board-component assembly 3, the second child board-component assembly 4, the electronic components 5a and 5b, and the one principal surface of the parent board 2.

Mounting the electronic component 5a the height of which from the one principal surface of the parent board 2 is greater than the distance between the first child board 3a and the parent board 2 in an area that is not overlapped with the first child board 3a and the second child board 4a when the one principal surface of the parent board 2 is viewed in plan allows the low profile of the module 1 to be achieved, compared with a configuration in which the electronic component 5a is mounted on either of both of the principal surfaces of the first child board 3a.

Second Embodiment

Figure 3A:
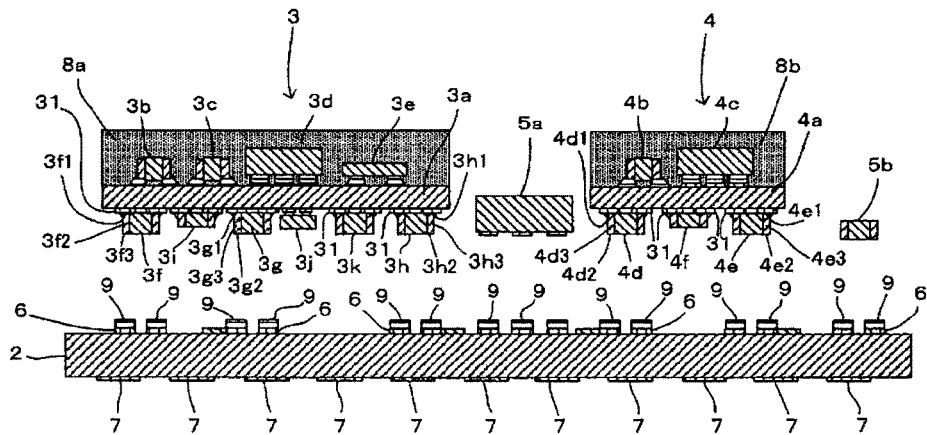
FIGS. 3A-3C include diagrams for describing a method of manufacturing a module according to a second embodiment of the present disclosure.
Figure 3B:
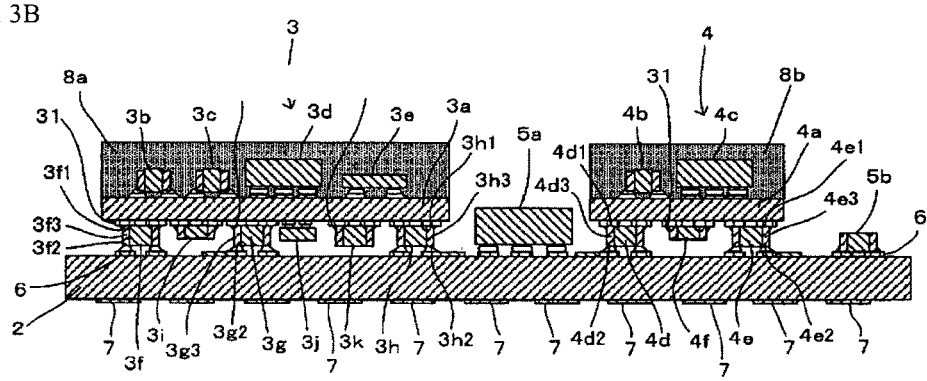
Figure 3C:
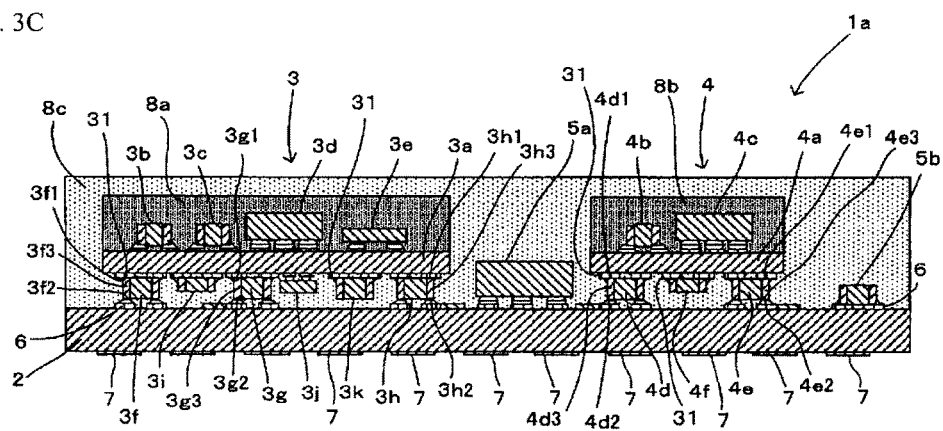

A module 1a according to a second embodiment of the present disclosure will now be described with reference to FIG. 3. FIG. 3 includes diagrams for describing a method of manufacturing the module 1a. FIG. 3(a) to FIG. 3(c) illustrate steps.

The module 1a of the present disclosure differs from the module 1 of the first embodiment described above with reference to FIG. 1 in that the module 1a is further provided with a resin layer 8a and a resin layer 8a, as illustrated in FIG. 3. The one principal surface of the first child board 3a in the first child board-component assembly 3 (the face on which the electronic components 3b to 3e are mounted) and the electronic components 3b to 3e mounted on the one principal surface are covered with the resin layer 8a. The one principal surface of the second child board 4a in the second child board-component assembly 4 (the face on which the electronic components 4b and 4c are mounted) and the electronic components 4b and 4c mounted on the principal surface are covered with the resin layer 8b. Since the remaining configuration is the same as that of the module 1 of the first embodiment, a description of the remaining configuration of the module 1a is omitted herein with the same reference numerals used.

(Method of Manufacturing Module 1a)

The first child board-component assembly 3, the second child board-component assembly 4, the electronic components 5a and 5b, and the parent board 2 are prepared in the same manner as in the method of manufacturing the module 1 of the first embodiment described above with reference to FIG. 2A. Here, the resin layer 8a is formed so that the one principal surface of the first child board 3a and the electronic components 3b to 3e mounted on the one principal surface are covered with the resin layer 8a in the first child board-component assembly 3 (refer to FIG. 3A). The resin layer 8b is formed so that the one principal surface of the second child board 4a and the electronic components 4b and 4c mounted on the one principal surface are covered with the resin layer 8b also in the second child board-component assembly 4 (refer to FIG. 3A). The resin layers 8a and 8b may be formed with various methods including a compression molding method, a transfer molding method, and a print method.

Next, as illustrated in FIG. 3B, the first child board-component assembly 3 having the resin layer 8a formed thereon, the second child board-component assembly 4 having the resin layer 8b formed thereon, and the electronic components 5a and 5b are mounted at certain positions on the one principal surface of the parent board 2 using a general component mounting apparatus. Then, the parent board 2 having the first child board-component assembly 3, the second child board-component assembly 4, and the electronic components 5a and 5b mounted thereon is put into a reflow oven or the like to mount the first child board-component assembly 3, the second child board-component assembly 4, and the electronic components 5a and 5b on the parent board 2. In order to facilitate the mounting (for example, suction of the components) with the component mounting apparatus, the surfaces of the resin layer 8a formed in the first child board-component assembly 3 and the resin layer 8b formed in the second child board-component assembly 4 may be made flat. Each of the resin layer 8a and the resin layer 8b corresponds to a first sealing resin layer of the present disclosure.

Finally, as illustrated in FIG. 3C, a resin layer 8c corresponding to a third sealing resin layer of the present disclosure) is formed so that the first child board-component assembly 3 including the resin layer 8a, the second child board-component assembly 4 including the resin layer 8b, and the one principal surface of the parent board 2 (the connection face with the electronic components 3f to 3k and the electronic components 4d to 4o are covered with the resin layer 8c to manufacture the module 1a. The resin layer 8c may also be formed with various methods including a compression molding method, a transfer molding method, and a print method. The module 1a may have a configuration in which the resin layer 8c is not formed. The resin layer 8c may be made of the same resin as that of the resin layers 8a and 8b or may be made of resin different from that of the resin layers 8a and 8b.

Accordingly, according to the present embodiment, since the resin layer 8a is formed on the one principal surface of the first child board 3a in the first child board-component assembly 3 and the resin layer 8b is formed on the one principal surface of the second child board 4a in the second child board-component assembly 4, the electronic components 3b to 3e mounted on the one principal surface of the first child board 3a and the electronic components 4b and 4c mounted on the one principal surface of the second child board 4a are protected with the resin layers 8a and 8b. Specifically, for example, in the mounting of the first child board-component assembly 3 and the second child board-component assembly 4 on the parent board 2, suctioning (picking up) the resin layer 8a and the resin layer 8b with a suction portion of the component mounting apparatus prevents the electronic components 3b to 3e mounted on the one principal surface of the first child board 3a and the electronic components 4b and 4c mounted on the one principal surface of the second child board 4a from being damaged in the mounting.

Since making the surfaces of the resin layers 8a and 8b flat ensures large suction areas when the first child board-component assembly 3 and the second child board-component assembly 4 are suctioned with the suction portion of the component mounting apparatus, the suction of the first child board-component assembly 3 and the second child board-component assembly 4 with the component mounting apparatus is facilitated to improve the mounting capability of both of the assemblies 3 and 4 on the parent board 2.

Since the first child board-component assembly 3, the second child board-component assembly 4, and the electronic components 5a and 5b are further covered with the resin layer 8c, it is possible to protect the components mounted on the one principal surface of the parent board 2 (the first child board-component assembly 3, the second child board-component assembly 4, and the electronic components 5a and 5b) while improving the mounting capability of the first child board-component assembly 3 and the second child board-component assembly 4 on the parent board 2.

Third Embodiment

Figure 4:
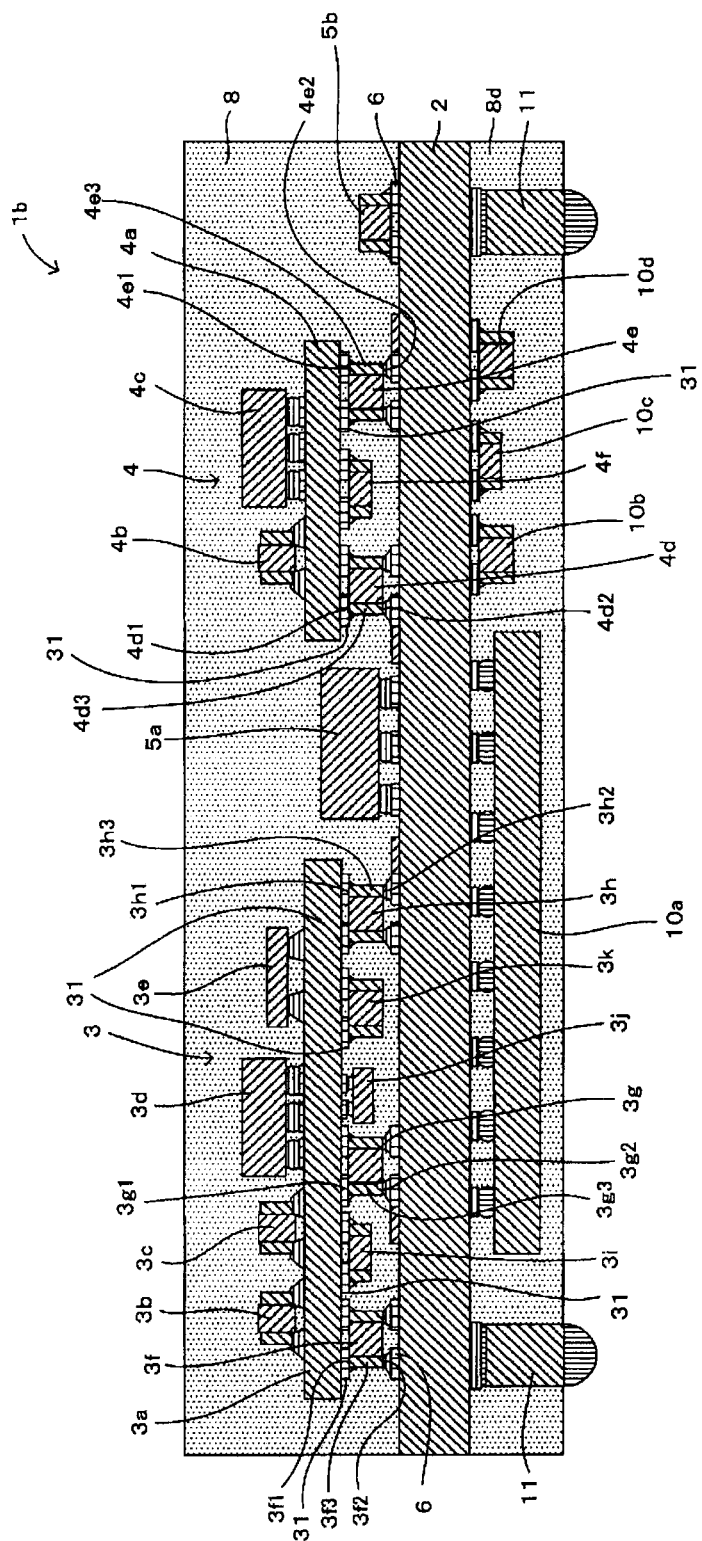
FIG. 4 is a cross-sectional view of a module according to a third embodiment of the present disclosure.

A module 1b according to a third embodiment of the present disclosure will now be described with reference to FIG. 4. FIG. 4 is a cross-sectional view of the module 1b.

The module 1b according to the present embodiment differs from the module 1 of the first embodiment described above with reference to FIG. 1 in that multiple electronic components 10a to 10d are mounted also on the other principal surface of the parent board 2, as illustrated in FIG. 4. Since the remaining configuration is the same as that of the module 1 of the first embodiment, a description of the remaining configuration of the module 1b is omitted herein with the same reference numerals used.

In this case, the electronic components 10a to 10d are mounted on the other principal surface opposite to the one principal surface of the parent board 2, on which the first child board-component assembly 3, the second child board-component assembly 4, and so on are mounted, using a surface mount technology and multiple columnar conductors 11 for connection to the outside are provided. In addition, a resin layer 8d with which the electronic components 10a to 10d and the columnar conductors 11 are covered is also provided on the other principal surface of the parent board 2. Each of the columnar conductors 11 may be, for example, a via conductor, a post electrode, or a pin conductor.

According to the present embodiment, since the electronic components 10a to 10d are mounted also on the other principal surface of the parent board 2, it is possible to mount the components in the module 1b with a high density.

Fourth Embodiment

Figure 5:
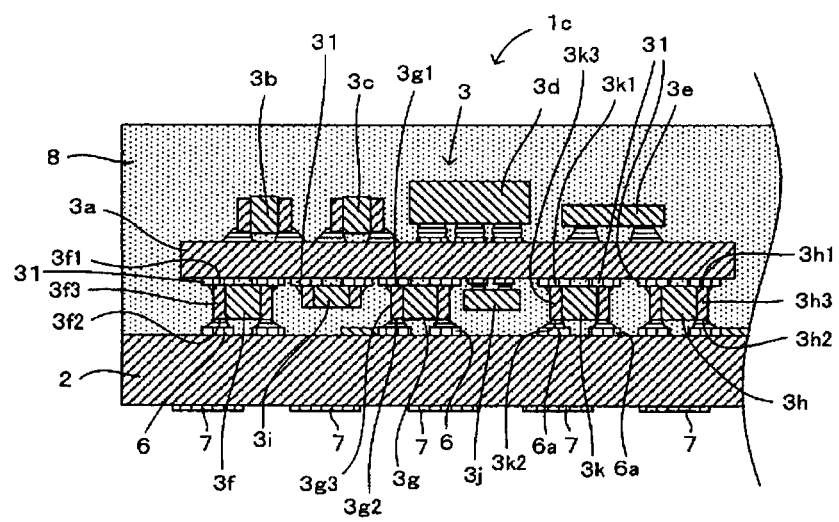
FIG. 5 is a cross-sectional view of a module according to a fourth embodiment of the present disclosure.

A module 1c according to a fourth embodiment of the present disclosure will now be described with reference to FIG. 5. FIG. 5 is a partial cross-sectional view of the module 1c and illustrates a portion where the first child board-component assembly 3 in the module 1c is arranged.

The module 1c according to the present embodiment differs from the module 1 of the first embodiment described above with reference to FIG. 1 in that the electronic component 3k, which is not connected to the parent board 2 in the module 1 of the first embodiment, among the electronic components 3f to 3k arranged between the first child board 3a in the first child board-component assembly 3 and the parent board 2, is also connected to the parent board 2, as illustrated in FIG. 5. Since the remaining configuration is the same as that of the module 1 of the first embodiment, a description of the remaining configuration of the module 1c is omitted herein with the same reference numerals used.

In this case, as illustrated in FIG. 5, the electronic component 3k includes two first electrodes 3k1 on a face facing the first child board 3a and two second electrodes 3k2 on a face facing the parent board 2. Both of the first electrodes 3k1 are connected to the other principal surface of the first child board 3a and both of the second electrodes 3k2 are connected to dummy electrodes 6a that are provided on the one principal surface of the parent board 2 and that are not connected to any electrode or the like in the parent board 2.

As described above, for example, when there is the electronic component 3k that is not required to be connected to the parent board 2, among the electronic components 3f to 3k mounted on the other principal surface of the first child board 3a, the provision of the dummy electrodes 6a on the one principal surface of the parent board 2 and the connection of both of the second electrodes 3k2 of the electronic component 3k to the dummy electrodes 6a allow the electronic component 3k to contribute to the improvement of the fixing function to fix the first child board 3a to the parent board 2. The present embodiment is also applicable to the second child board-component assembly 4.

Fifth Embodiment

Figure 6:
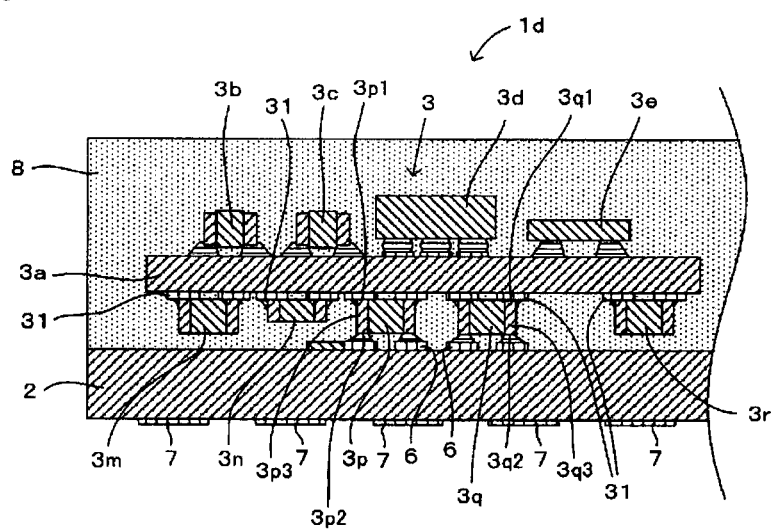
FIG. 6 is a cross-sectional view of a module according to a fifth embodiment of the present disclosure.

A module 1d according to a fifth embodiment of the present disclosure will now be described with reference to FIG. 6. FIG. 6 is a partial cross-sectional view of the module 1d and illustrates a portion where the first child board-component assembly 3 in the module 1d is arranged.

The module 1d according to the present embodiment differs from the module 1 of the first embodiment described above with reference to FIG. 1 in that first electrodes 3p1 and 3q1 in electronic components 3p and 3q, respectively, connected to both the first child board 3a in the first child board-component assembly 3 and the parent board 2 are connected to the other principal surface of the first child board 3a at substantially the center, as illustrated in FIG. 6. Since the remaining configuration is the same as that of the module 1 of the first embodiment, a description of the remaining configuration of the module 1d is omitted herein with the same reference numerals used.

In this case, multiple electronic components 3m, 3n, and 3p to 3r are mounted on the other principal surface of the first child board 3a in the first child board-component assembly 3. The first electrodes 3p1 and 3q1 in the two electronic components 3p and 3q, respectively, arranged at substantially the center of the other principal surface of the first child board 3a, among the electronic components 3m, 3n, and 3p to 3r, are connected to the first child board 3a and second electrodes 3p2 and 3q2 are connected to the parent board 2 (the mounting electrodes 6).

When the first child board 3a is thermally contracted, the amount of contraction of the first child board 3a at the center is smaller than that on the fringe. As a result, the stress applied on the connection portions between the first electrodes 3p1 and 3q1 and the first child board 3a when the first electrodes 3p1 and 3q1 in the electronic components 3p and 3q, respectively, are connected to the center of the first child board 3a is lower than that when the first electrodes 3p1 and 3q1 in the electronic components 3p and 3q, respectively, are connected to the fringe of the first child board 3a. Accordingly, the connection of the first electrodes 3p1 and 3q1 in the electronic components 3p and 3q, respectively, to substantially the center of the other principal surface of the first child board 3a improves the reliability of the connection between the first child board 3a and the electronic components 3p and 3q.

Sixth Embodiment

Figure 7A:
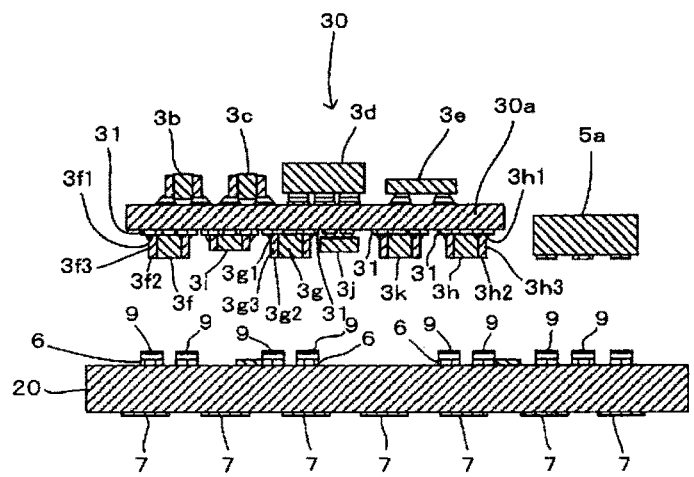
FIGS. 7A-7C include diagrams for describing a method of manufacturing a module according to a sixth embodiment of the present disclosure.
Figure 7B:
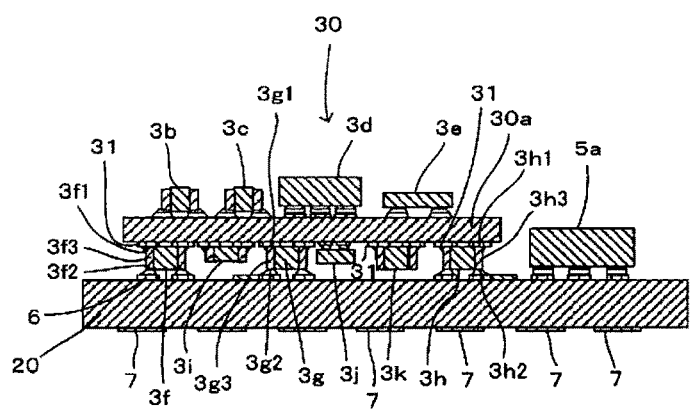
Figure 7C:
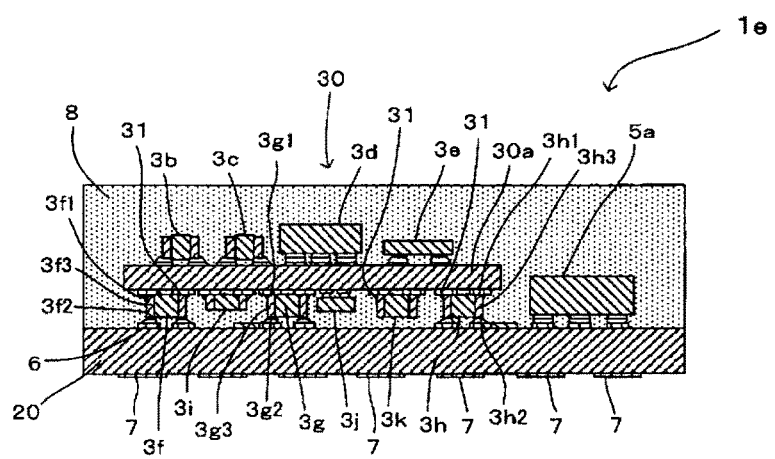

A module 1e according to a sixth embodiment of the present disclosure will now be described with reference to FIGS. 7A-7C. FIGS. 7A-7C include diagrams for describing a method of manufacturing the module 1e. FIG. 7A to FIG. 7C illustrate steps in the manufacturing method.

The module 1e of the present embodiment differs from the module 1 of the first embodiment described above with reference to FIG. 1 in a step of preparing a module component 30 corresponding to the first child board-component assembly 3 in the module 1 of the first embodiment in the method of manufacturing the module 1e. Since the remaining configuration is the same as that of the module 1 of the first embodiment, a description of the remaining configuration of the module 1e is omitted herein with the same reference numerals used. The method of manufacturing the module 1e will now be described.

First, as illustrated in FIG. 7A, the module component 30, the electronic component 5a, and a parent board 20 (corresponding to a mounting board of the present disclosure) are prepared. The module component 30 is produced by mounting the electronic components 3b to 3k on both principal surfaces of a first child board 30a using a surface mount technology. The parent board 20 has the multiple mounting electrodes 6 formed on one principal surface thereof and has the multiple outer electrodes 7 for connection to the outside, which are formed on the other principal surface thereof. The solder paste 9 is applied in advance on each of the mounting electrodes 6 formed on the one principal surface of the parent board 20 using a print technology or the like.

The preparation of the module component 30 to be mounted on the parent board 20 will be specifically described. In the mounting of the module component 30 on the parent board 20, the multiple electronic components 3b to 3e are mounted on one principal surface of the first child board 30a arranged so as to face the parent board 20 with solder and the multiple electronic components 3f to 3k are mounted on the other principal surface of the first child board 30a (the face facing the parent board 20) with solder.

Figures 8, 9, 10:
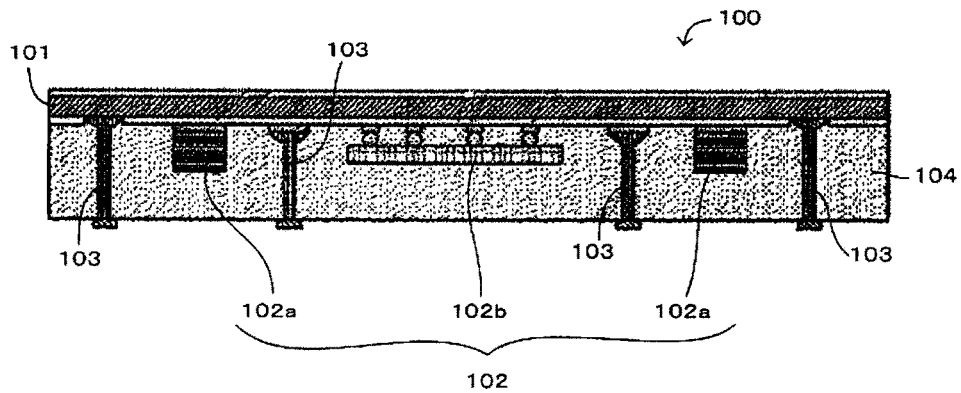
FIG. 8 is a configuration diagram illustrating combinations of a component-side electrode, a board-side electrode, and solder paste.
FIG. 9 illustrates the relationship between Cu-M alloy (M indicates Mn or Ni) contained in a connection portion between the component-side electrode the board-side electrode and the remaining percentage of Sn.
FIG. 10 is a cross-sectional view of a module in the related art.

Here, in each of the electronic components 3f to 3k mounted at the other principal surface side of the first child board 30a, the electrodes involved in the connection and the solder (the solder paste) are made of any of combinations of materials illustrated in FIG. 8. FIG. 8 is a table illustrating the combinations of the materials of component-side electrodes, the board-side electrodes 31, and the solder paste. The first electrodes 3f1 to 3h1 of the electronic components 3f to 3h, respectively, at the other principal surface side of the first child board 30a, which are connected to both the first child board 30a and the parent board 20, and electrodes for mounting the remaining electronic components 3i to 3k at the other principal surface side of the first child board 30a on the first child board are collectively referred to as the component-side electrodes. Referring to FIG. 8, in a row of the board-side electrodes 31, Cu-M indicates a plate electrode containing Cu—Mn alloy or Cu—Ni alloy and Ni/Au indicates a plate electrode in which Au layers are laminated on a Ni layer. In a row of the solder paste, Sn system indicates solder paste containing Sn and Cu—Mn indicates solder paste containing Cu—Mn alloy or Cu—Ni alloy. In a row of the component-side electrodes, Sn system indicates a plate electrode containing Sn and Cu-M indicates a plate electrode containing Cu—Mn alloy or Cu—Ni alloy.

In this case, in all the combinations of (i) to (vii) illustrated in FIG. 8, at least one of the component-side electrodes, the board-side electrodes 31, and the solder paste contains the Cu-M alloy (M indicates Mn or Ni). With such combinations, after the electronic components 3f to 3k are mounted on the first child board 30a, high melting point metal (Sn—Cu-M alloy) produced from an intermetallic compound formed between the Cu-M alloy and Sn is formed in connection portions between the electronic components 3f to 3k and the first child board 30a.

The high melting point of the Sn—Cu-M alloy (M indicates Mn or Ni) is realized by the intermetallic compound formed between Sn and the Cu-M alloy. More stable high melting point alloy is considered to be produced with the increasing amount of the generated intermetallic compound. The amount of the generated intermetallic compound in the connection portions is considered to be increased with the decreasing remaining amount of the Sn component contained in the connection portions after the board-side electrodes 31 are connected to the component-side electrodes with the solder. Accordingly, the inventor prepared multiple samples (nine pieces of data in FIG. 9) in which the amount of M contained in the Cu-M alloy is varied by experiment and measured the remaining percentage of low melting point Sn that does not contribute to the formation of the intermetallic compound in the connection portions between the board-side electrodes 31 and the first electrodes 3$f$1 to 3$h$1 (the volume % of the remaining Sn in the connection portions).

The measurement indicated that the remaining Sn component is decreased to some extent when the amount of M contained in the Cu-M alloy is 5% by weight to 30% by weight and the remaining Sn component is further decreased when the amount of M contained in the Cu-M alloy is 10% by weight to 15% by weight, as illustrated in FIG. 9. Accordingly, in order to produce the high melting point alloy in the connection portions between the component-side electrodes and the board-side electrodes 31, the amount of M contained in the Cu-M alloy may be 5% by weight to 30% by weight or 10% by weight to 15% by weight in the connection portions. The result of the measurement illustrated in FIG. 9 was given by differential scanning calorimetry (DSC measurement). Specifically, boundary portions between the component-side electrodes and the board-side electrodes 31 were cut out in each sample and the remaining amount of Sn component was quantified from the amount of heat absorption at a melting-absorption peak of the melting temperature of Sn in a DSC chart created in the DSC measurement. Then, the percentage of the Sn component to the entire metallic component was calculated from the amount of Sn component as the "remaining percentage of the low melting point metal."

Next, as illustrated in FIG. 7B, the module component 30 and the electronic component 5$a$, which are prepared, are mounted at certain positions on the one principal surface of the parent board 20 using a general component mounting apparatus. Then, the parent board 20 having the module component 30 and the electronic component 5$a$ mounted thereon is put into a reflow oven or the like to mount the module component 30 and the electronic component 5$a$ on the one principal surface of the parent board 20. Here, the second electrodes 3$f$2 to 3$h$2 in the electronic components 3$f$ to 3$h$, respectively, mounted on the other principal surface of the first child board 30$a$ in the module component 30 are connected to the corresponding mounting electrodes 6 on the parent board 20 using the solder that does not contain the Cu-M alloy (M indicates Mn or Ni) to mount the module component 30 on the parent board 20. An upper face of the electronic component 3$d$ (IC) mounted on the one principal surface of the first child board 30$a$ is used for the pickup of the module component 30 by the component mounting apparatus.

As described above, since the high melting point Sn—Cu-M alloy is formed in the connection portion with the first child board 30$a$ in each of the electronic components 3$f$ to 3$k$ mounted on the other principal surface of the first child board 30$a$ in the module component 30, the Sn—Cu-M alloy does not melt in the connection portion of each of the electronic components 3$f$ to 3$k$ in the reflow oven the temperature profile of which is set for the solder that does not contain the Cu-M alloy in the mounting of the module component 30 on the parent board 20. Accordingly, in the present embodiment, the module component 30 is configured so that position shifts of the electronic components 3$f$ to 3$k$ and/or solder drips, which are caused by the melting of the alloy forming the connection portions of the electronic components 3$f$ to 3$k$, are prevented even when the module component 30 is placed at a certain temperature (a temperature at which the solder that does not contain the Cu-M alloy melts) in the reflow oven.

Finally, as illustrated in FIG. 7C, the resin layer 8 is formed so that the module component 30, the electronic component 5$a$, and the one principal surface of the parent board 20 are covered with the resin layer 8 to manufacture the module 1$e$. Here, the resin layer 8 may be formed with various methods including a compression molding method, a transfer molding method, and a print method.

The configuration in which any one of the component-side electrodes, the board-side electrodes 31, and the solder paste contains the Cu-M alloy and the configuration involved in the amount of M contained in the Cu-M alloy (weight percent) are also applicable to the other embodiments described above.

Accordingly, according to the present embodiment, since the module component 30 is mounted on the parent board 20 by connecting the second electrodes 3$f$2 to 3$h$2 of the electronic components 3$f$ to 3$h$, respectively, in the module component 30 to the parent board 20, it is not necessary to provide the columnar conductors used to connect the first electrodes 3$f$1 to 3$h$1 of the electronic components 3$f$ to 3$h$, respectively, in the module component 30 to the parent board 20. Consequently, it is not necessary to ensure the areas in which the columnar conductors are mounted on the first child board 30$a$ in the module component 30. As a result, the area of the principal surface of the first child board 30$a$ is capable of being decreased, thereby reducing the size of the module component 30.

Since the configuration is adopted in which the board-side electrodes 31 are formed on the face facing the parent board 20 of the first child board 30$a$ and the first electrodes 3$f$1 to 3$h$1 of the functional components (the electronic components 3$f$ to 3$h$, respectively) are connected to the board-side electrodes 31 with solder, it is possible to connect the board-side electrodes 31 on the first child board 30$a$ to the first electrodes 3$f$1 to 3$h$1 of the functional components with the solder, which is commonly used as the material for connection of the electrodes.

In the configuration in the related art in which the columnar conductors for the connection to the parent board 20 are provided in the module component 30, since the lengths of the columnar conductors are required to be greater than the heights of the electronic components 3$f$ to 3$k$, mounted on the other principal surface of the first child board 30$a$, from the first child board 30$a$, it is difficult to achieve the low profile of the module component 30. However, with the above configuration, it is possible to mount the module component 30 on the parent board 20 without necessarily providing the columnar conductors by connecting the second electrodes 3$f$2 to 3$h$2 of the electronic components 3$f$ to 3$h$, respectively, to the parent board 20. Accordingly, it is possible to achieve the low profile of the module component 30.

When the parent board 20 is connected to the first electrodes 3$f$1 to 3$h$1 of the electronic components 3$f$ to 3$h$, respectively, via the columnar conductors, as in the related art, it is necessary to provide the wiring electrodes used to connect the columnar conductors to the first electrodes 3$f$1 to 3h1 on the first child board 30a. However, with the above configuration, it is not necessary to provide the wiring electrodes used to connect the first electrodes 3f1 to 3h1 to the columnar conductors on the first child board 30a because the first electrodes 3f1 to 3h1 are mounted on the parent board 20 via the second electrodes 3f2 to 3h2 electrically connected to the first electrodes 3f1 to 3h1. Accordingly, since the area of the principal surface of the first child board 30a or the number of layers of the first child board 30a is decreased by the amount corresponding to the non-provision of the wiring electrodes, it is possible to reduce the size of the module component 30 and to achieve the low profile of the module component 30. In addition, for example, when high-frequency signals are used for the module component 30, it is possible to prevent an increase in unnecessary impedance and an increase in a parasitic component, such as parasitic inductance, which are caused by the increase in length of the wiring electrodes, and it is possible to prevent an increase in unnecessary radiant waves occurring from the wiring electrodes. Accordingly, the module component 30 having excellent high-frequency characteristics is provided.

The present disclosure is not limited to these above embodiments and many changes and modified embodiments may be made without necessarily departing from the true spirit and scope of the disclosure.

For example, although the case has been described in the above embodiments in which the electronic components 3f to 3h, 3p, 3q, 4d, and 4e connected to both the first child board 3a or 30a (or the second child board 4a) and the parent board 2 or 20 are chip components, such as chip capacitors, the electronic components 3f to 3h, 3p, 3q, 4d, and 4e connected to both the first child board 3a or 30a (or the second child board 4a) and the parent board 2 or 20 may be ICs. In this case, a first electrode may be formed on a face of each IC, which faces the first child board 3a or 30a (or the second child board 4a), a second electrode may be formed on a face of each IC, which faces the parent board 2, and the first electrode may be electrically connected to the second electrode in the IC.

In addition, a configuration may be adopted in which all of the electronic components 3f to 3k, 3m, 3n, 3p to 3r, and 4d to 4f arranged between the first child board 3a or 30a (or the second child board 4a) and the parent board 2 or 20 are connected to both the first child board 3a or 30a (or the second child board 4a) and the parent board 2 or 20. In this case, for example, in the electronic components that are not required to be connected to the parent board 2 or 20, among the electronic components 3f to 3k, 3m, 3n, 3p to 3r, and 4d to 4f, the second electrodes may be connected to the dummy electrodes 6a provided on the parent board 2 or 20, as in the module 1c of the fourth embodiment. This further improves the fixing function to fix the first child board 3a or 30a (or the second child board 4a) to the parent board 2 or 20 by the electronic components 3f to 3k, 3m, 3n, 3p to 3r, and 4d to 4f.

INDUSTRIAL APPLICABILITY

The present disclosure is applicable to various modules each having electronic components arranged between two boards.

REFERENCE SIGNS LIST 1, 1a, 1b, 1c, 1d, 1e module
2 parent board (second circuit board)
3a, 30a first child board (first circuit board)
4a second child board (first circuit board)
3b to 3e, 4b, 4c electronic component (first electronic component)
3f to 3h, 3p, 3q, 4d, 4e electronic component (functional component)
3f1 to 3h1, 3p1, 3q1, 4d1, 4e1 first electrode
3f2 to 3h2, 3p2, 3q2, 4d2, 4e2 second electrode
5a electronic component (second electronic component)
6a dummy electrode
8 resin layer (second sealing resin layer)
8a, 8b resin layer (first sealing resin layer)
8c resin layer (third sealing resin layer)
20 parent board (mounting board)
30 module component
31 board-side electrode

The invention claimed is:

1. A module comprising:
a first circuit board;
a second circuit board arranged so as to face the first circuit board; and
a functional component that includes a first electrode and a second electrode, the second electrode electrically connected to the first electrode, the functional component disposed on both opposing faces of the first circuit board and the second circuit board, the first electrode being connected to the first circuit board, the second electrode being connected to the second circuit board, the functional component comprising a chip component,
wherein an area of either one of the first circuit board and the second circuit board viewed in plan is greater than an area of the other of the first circuit board and the second circuit board,
wherein the module further includes a second electronic component mounted on an area that is on a connection face of either one of the first circuit board and the second circuit board with the functional component, which has an area greater than that of the other of the first circuit board and the second circuit board, and that is not overlapped with the other of the first circuit board and the second circuit board viewed in plan, and
wherein a height of the second electronic component is greater than a distance between the first circuit board and the second circuit board.

2. The module according to claim 1,
wherein a board-side electrode is provided on a face of the first circuit board facing the second circuit board, and
wherein the first electrode is connected to the board-side electrode with solder.

3. The module according to claim 2,
wherein at least one of the board-side electrode, the first electrode, and the solder contains Cu-M alloy, where M indicates Mn or Ni.

4. The module according to claim 2,
wherein an amount of the M contained in the Cu-M alloy is 5% by weight to 30% by weight.

5. The module according to claim 1,
wherein the first electrode of the functional component is connected to the first circuit board at the center of the first circuit board.

6. The module according to claim 1,
wherein the module includes a plurality of the functional components including a plurality of first electrodes and a plurality of second electrodes.

7. The module according to claim 6,
wherein a second electrode among the plurality of second electrodes of part of the plurality of functional components is connected to a dummy electrode provided on the second circuit board.

8. The module according to claim 1, further comprising:
a first electronic component mounted on a face opposite to a connection face of either one of the first circuit board and the second circuit board with the functional component.

9. The module according to claim 8, further comprising:
a first sealing resin layer which is provided over a face of either one of the first circuit board and the second circuit board on which the first electronic component is mounted, the first sealing resin layer covering the first electronic component.

10. The module according to claim 9, further comprising:
a third sealing resin layer covering the first sealing resin layer and a connection face of the other of the first circuit board and the second circuit board with the functional component.

11. The module according to claim 8, further comprising:
a second sealing resin layer covering the first electronic component and either one of the first circuit board and the second circuit board, the second sealing resin layer covering a connection face of the other of the first circuit board and the second circuit board with the functional component.

12. A module component mounted on a mounting board, the module component comprising:
a first circuit board arranged so as to face the mounting board while mounting of the module component on the mounting board; and
a functional component which includes a first electrode and a second electrode, the second electrode electrically connected to the first electrode, the functional component disposed on both opposing faces of the first circuit board and the mounting board, the first electrode being connected to the first circuit board, the functional component comprising a chip component,
wherein the module component is mounted on the mounting board by connecting the second electrode of the functional component to the mounting board,
wherein an area of either one of the first circuit board and the second circuit board viewed in plan is greater than an area of the other of the first circuit board and the second circuit board,
wherein the module further includes a second electronic component mounted on an area that is on a connection face of either one of the first circuit board and the second circuit board with the functional component, which has an area greater than that of the other of the first circuit board and the second circuit board, and that is not overlapped with the other of the first circuit board and the second circuit board viewed in plan, and
wherein a height of the second electronic component is greater than a distance between the first circuit board and the second circuit board.

13. The module component according to claim 12,
wherein a board-side electrode is provided on a face of the first circuit board facing the mounting board, and
wherein the first electrode is connected to the board-side electrode with solder.

14. The module component according to claim 13,
wherein at least one of the board-side electrode, the first electrode, and the solder contains Cu-M alloy, where M indicates Mn or Ni.

15. The module component according to claim 14,
wherein an amount of the M contained in the Cu-M alloy is 5% by weight to 30% by weight.

16. A method of manufacturing a module, the method comprising:
preparing a board-component assembly which includes a functional component having a first electrode and a second electrode, the second electrode electrically connected to the first electrode, the functional component disposed on both opposing faces and a first circuit board, the first electrode being connected to the first circuit board, the functional component comprising a chip component;
mounting the board-component assembly on a second circuit board by arranging a connection face of the functional component of the first circuit board with the first electrode so as to face one principal surface of the second circuit board and connecting the second electrode of the functional component to the one principal surface of the second circuit board; and
providing a resin layer so that the one principal surface of the second circuit board and the board-component assembly mounted on the one principal surface of the second circuit board are covered with the resin layer,
wherein an area of either one of the first circuit board and the second circuit board viewed in plan is greater than an area of the other of the first circuit board and the second circuit board,
wherein the module further includes a second electronic component mounted on an area that is on a connection face of either one of the first circuit board and the second circuit board with the functional component, which has an area greater than that of the other of the first circuit board and the second circuit board, and that is not overlapped with the other of the first circuit board and the second circuit board viewed in plan, and
wherein a height of the second electronic component is greater than a distance between the first circuit board and the second circuit board.

17. The module according to claim 1,
wherein the first electrode of the functional component is connected to the first circuit board at substantially the center of the first circuit board where an amount of contraction of the first child board is smaller than an amount of contraction of the first child board at the fringe of the first child board.

* * * * *

UNITED STATES PATENT AND TRADEMARK OFFICE
CERTIFICATE OF CORRECTION

PATENT NO. : 10,098,229 B2
APPLICATION NO. : 14/832201
DATED : October 9, 2018
INVENTOR(S) : Yoichi Takagi et al.

Page 1 of 1

It is certified that error appears in the above-identified patent and that said Letters Patent is hereby corrected as shown below:

In the Specification

Column 15, Line 21, "40" should be -- 4f) --.

Signed and Sealed this
Eighth Day of January, 2019

Andrei Iancu
*Director of the United States Patent and Trademark Office*